(12) United States Patent
Ribberink

(10) Patent No.: US 11,959,334 B2
(45) Date of Patent: Apr. 16, 2024

(54) MULTIFUNCTIONAL GLAZING UNIT

(71) Applicant: PILKINGTON GROUP LIMITED, Lathom (GB)

(72) Inventor: Marcel Ribberink, Enschede (NL)

(73) Assignee: Pilkington Group Limited, Lathom (GB)

( * ) Notice: Subject to any disclaimer, the term of this patent is extended or adjusted under 35 U.S.C. 154(b) by 342 days.

(21) Appl. No.: 16/763,270

(22) PCT Filed: Nov. 13, 2018

(86) PCT No.: PCT/GB2018/053286
§ 371 (c)(1),
(2) Date: May 12, 2020

(87) PCT Pub. No.: WO2019/092458
PCT Pub. Date: May 16, 2019

(65) Prior Publication Data
US 2020/0332593 A1 Oct. 22, 2020

(30) Foreign Application Priority Data
Nov. 13, 2017 (GB) ..................................... 1718715

(51) Int. Cl.
*H02S 40/22* (2014.01)
*E06B 9/24* (2006.01)
(Continued)

(52) U.S. Cl.
CPC ............ *E06B 9/24* (2013.01); *H01L 31/0216* (2013.01); *H01L 31/0488* (2013.01);
(Continued)

(58) Field of Classification Search
CPC . H02S 40/22; H01L 31/0216; H01L 31/0488; E06B 2009/2464; E06B 2009/2476
See application file for complete search history.

(56) References Cited

U.S. PATENT DOCUMENTS

| 4,186,033 A | * | 1/1980 | Boling | .................... H02S 40/44 |
| | | | | 126/634 |
| 4,927,721 A | | 5/1990 | Gratzel et al. | |

(Continued)

FOREIGN PATENT DOCUMENTS

| CN | 206250208 U | 6/2017 |
| GB | 2490881 A | 11/2012 |

(Continued)

OTHER PUBLICATIONS

GB Intellectual Property Office, Search Report, issued in GB 1718715.4, dated Apr. 27, 2018, 1 page, GB Intellectual Property Office, Newport, South Wales.

(Continued)

*Primary Examiner* — Uyen M Tran
(74) *Attorney, Agent, or Firm* — Marshall & Melhorn, LLC

(57) ABSTRACT

The present invention relates to a multifunctional glazing unit suitable for generating electricity, to a method of preparing same and use thereof, said multifunctional glazing unit comprising a first sheet of glazing material comprising a first face and a second face, a second sheet of glazing material comprising a first face and a second face, a photovoltaic portion, and a reflecting element, wherein the first sheet of glazing material and the second sheet of glazing material are separated by a cavity, the second faces of each sheet of glazing material face towards the cavity, the photovoltaic portion and the reflecting element are each positioned between the first sheet of glazing material and the second sheet of glazing material, and wherein the photovoltaic portion comprises a transparent region, a bi-facial region, and at least one photovoltaic element.

19 Claims, 6 Drawing Sheets

(51) Int. Cl.
    *H01L 31/0216*    (2014.01)
    *H01L 31/048*    (2014.01)
(52) U.S. Cl.
    CPC ...... *H02S 40/22* (2014.12); *E06B 2009/2464* (2013.01); *E06B 2009/2476* (2013.01)

(56) References Cited

U.S. PATENT DOCUMENTS

| | | | |
|---|---|---|---|
| 5,084,365 | A | 1/1992 | Gratzel et al. |
| 5,935,716 | A | 8/1999 | McCurdy et al. |
| 6,238,738 | B1 | 5/2001 | McCurdy |
| 6,297,900 | B1 | 10/2001 | Tulloch et al. |
| 7,649,140 | B2 | 1/2010 | Skrabin et al. |
| 8,046,960 | B1 | 11/2011 | Kapany |
| 8,766,086 | B2 | 7/2014 | Maheshwari et al. |
| 8,814,374 | B2 | 8/2014 | Van Der Poel et al. |
| 9,080,376 | B2 | 7/2015 | Pellini et al. |
| 9,812,590 | B2 | 11/2017 | Kim et al. |
| 10,243,087 | B2 | 3/2019 | Kim et al. |
| 2003/0169476 | A1* | 9/2003 | Yoshimura ............ G02F 1/1523 359/265 |
| 2009/0000613 | A1* | 1/2009 | Edwards ............. H01L 31/0547 126/684 |
| 2009/0159077 | A1* | 6/2009 | Bijl .................... H01L 31/0547 126/684 |
| 2012/0011782 | A1 | 1/2012 | Kolas et al. |
| 2012/0097213 | A1 | 4/2012 | Weidner |
| 2012/0279147 | A1 | 11/2012 | Kapany |
| 2013/0061542 | A1 | 3/2013 | Weidner |
| 2016/0333636 | A1 | 11/2016 | Bonucci |
| 2019/0157468 | A1 | 5/2019 | Kim et al. |

FOREIGN PATENT DOCUMENTS

| | | |
|---|---|---|
| KR | 20120026286 A | 3/2012 |
| WO | 2008/149278 A1 | 12/2008 |
| WO | 2014/066265 A1 | 5/2014 |

OTHER PUBLICATIONS

European Patent Office, International Search Report with Written Opinion, issued in PCT/GB2018/053286, dated Feb. 15, 2019, 12 pages, European Patent Office, Rijswijk, Netherlands.

* cited by examiner

MULTIFUNCTIONAL GLAZING UNIT

BACKGROUND OF THE INVENTION

The present invention relates to a multifunctional glazing unit. More particularly, the invention relates to a multifunctional glazing unit suitable for generating electricity in a building, a process for manufacturing the same, and the use of the same in a building.

Photovoltaic devices have been known for some time and are often disposed in fields or upon rooftops to generate electrical energy. However, most of these photovoltaic devices are opaque and therefore are not suitable for use in a glazing unit such as a window or door. Transparent photovoltaic devices for use in window assemblies are known, but are not without drawbacks.

For example, US 20130061542 A1 discloses an improved photovoltaic window assembly, wherein the assembly includes a photovoltaic element, a solar control coating and a cavity. The use of the photovoltaic element and solar control coating leads to a photovoltaic window assembly which provides thermal solar control and utilizes solar radiation incident upon the window assembly to create electrical energy. However, the efficiency of the disclosed photovoltaic window assembly may be limited in some situations by the transmission of light at wavelengths useful for the generation of electricity. In addition, where light incident on the assembly is particularly intense, maintaining the temperature of a room associated with the multi-functional window assembly at a comfortable level may be difficult.

Likewise, WO 2008149278 A1 discloses a window element comprising panes between which a window blind is arranged. The window blind comprises a plurality of slats with at least one solid state device such as a LED, photodiode or photovoltaic device. However, in WO 2008149278 A1 the disclosed window element appears to be of a complicated design and may therefore be difficult to manufacture in a way that ensures that an electrical circuit incorporates the slat mounted photovoltaic devices effectively.

US 2016333636 A1 discloses an active window comprising two glass panes spaced apart by a distance d, and a frame for the hermetic sealing of the active window. Also present is a Venetian blind with a number of slats parallel to each other and disposed within said window. The slats comprise electrochromic material capable of varying their light throughput by controlling the transmittance and/or reflectance of the slats. The slats may be photovoltachromic slats that are capable of generating the energy required to tilt the slats. However, this arrangement is effective only for finely controlling the amount of light reaching a building interior. The document does not describe how energy may be generated that may be supplied to an external circuit.

U.S. Pat. No. 6,297,900 B1 discloses a "smart window" wherein a photovoltaic element is utilized to power and control an electrochromic element. The electrochromic element provides solar control properties by darkening or lightening to allow more or less solar radiation to pass through the smart window.

U.S. Pat. No. 9,080,376 B2 discloses a Venetian blind with a series of slats inside a glass-enclosed chamber, wherein the slats comprise a reflective layer. While the amount of solar energy entering a room associated with the chamber may be controlled no details are provided regarding the generation of electricity.

SUMMARY OF THE INVENTION

It is an object of the present invention to provide an alternative multifunctional glazing unit that is able to generate electrical energy which may be used by an external circuit in an efficient manner. More specifically, it is an object of the present invention to provide an alternative multifunctional glazing unit that is able to both generate electrical energy which may be used by an external circuit in an efficient manner and which is able to provide variable light transmission.

According to a first aspect of the invention there is provided a multifunctional glazing unit suitable for generating electricity comprising:

a first sheet of glazing material comprising a first face and a second face;

a second sheet of glazing material comprising a first face and a second face;

a photovoltaic portion; and a reflecting element;

wherein the first sheet of glazing material and the second sheet of glazing material are separated by a cavity; and wherein the second faces of each sheet of glazing material face towards the cavity; and wherein the photovoltaic portion and the reflecting element are each positioned between the first sheet of glazing material and the second sheet of glazing material; and wherein the photovoltaic portion comprises a transparent region, a bi-facial region, and at least one photovoltaic element.

Preferably, the cavity is sealed by at least one spacer bar. Alternatively, the cavity may be sealed by two or more spacer bars.

In addition, the photovoltaic portion preferably comprises a first region with a first transparency value and a second region with a second transparency value; and wherein the first transparency value is preferably greater than the second transparency value.

In relation to the present invention, the photovoltaic portion comprises a transparent region, that is a photovoltaic portion capable of transmitting a first proportion of light incident upon the transparent region and absorbing a second proportion of light incident upon either the transparent region or another region of the photovoltaic portion. The photovoltaic portion preferably has an overall transparency of from 50% to 70%; more preferably from 55% to 65%, where the overall transparency is the amount of light transmitted by the photovoltaic portion compared to the amount of light incident on the photovoltaic portion expressed as a percentage. The first proportion of light may be at a similar wavelength to that of the second proportion of light, or may be different. Light absorbed or transmitted by the photovoltaic portion may be selected for example from the group comprising: visible light; infra-red light; ultra-violet light; or a combination thereof.

Preferably the proportion of light reflected by the photovoltaic portion is less than the proportion absorbed by the photovoltaic portion.

It is also preferred that the photovoltaic portion has a first face and a second face. Preferably the first face of photovoltaic portion provides a power output of greater than or equal to 50 W/m$^2$; more preferably greater than or equal to 60 W/m$^2$; most preferably greater than or equal to 65 W/m$^2$ as measured according to IEC standard 61215, incorporated herein by reference: with irradiance 1 kW/m$^2$, spectral distribution AM (airmass) 1.5 and cell temperature 25° C.

Preferably the efficiency of the first face of the photovoltaic element is greater than or equal to 5%; more preferably greater than or equal to 6.5% as measured according to IEC standard 61215: with irradiance 1 kW/m$^2$, spectral distribution AM (airmass) 1.5 and cell temperature 25° C.

The bifaciality factor of the photovoltaic portion is preferably at least 50%; more preferably at least 75%. The bifaciality factor relates to the photovoltaic efficiency of the second face divided by that of the first face represented as a percentage.

Also in relation to the first aspect of the present invention, the photovoltaic element preferably comprises one or more of: a thin film photovoltaic element; a silicon photovoltaic element; a cadmium telluride photovoltaic element; a perovskite photovoltaic element; one or more strip photovoltaic elements; or a combination thereof.

A thin film photovoltaic element provides the advantage of ease of handling, as it may be applied to a carrier substrate, such as a sheet of glazing material or a sheet of interlayer material. Where the photovoltaic element is a thin film photovoltaic element it is preferably a dye-sensitised solar element, also known as a regenerative photo-electrochemical element and/or a nano-dye solar element. Examples of suitable thin film photovoltaic elements suitable for use in the present invention include for example those described in U.S. Pat. Nos. 4,927,721 A, 6,297,900 B1 and 7,649,140 B2, incorporated herein by reference.

Where the photovoltaic element comprises opaque elements, that is substantially non-transparent elements, it is preferable that these elements are in "direct registration" or "back to back" formation, such that the opaque elements for absorbing light incident on the first sheet of glazing material substantially overlap the opaque elements for absorbing light incident on the second sheet of glazing material. Preferably the opaque elements for absorbing light incident on the first sheet of glazing material completely overlap the opaque elements for absorbing light incident on the second sheet of glazing material.

Preferably, the photovoltaic element comprises two or more strip photovoltaic elements. Preferably, the two or more strip photovoltaic elements are spaced apart, preferably substantially in parallel.

Where the photovoltaic element comprises two or more spaced apart strip photovoltaic elements, these are preferably arranged in a substantially parallel arrangement to each other. The two or more strip photovoltaic elements are preferably spaced apart from one another by a distance d. Such spacing is known as the pitch. Preferably the pitch of the two or more strip photovoltaic elements d is from 2 mm to 6 mm; more preferably from 3 mm to 3.5 mm. In addition, such photovoltaic elements comprising two or more strips preferably comprise one or more "strings". The one or more "strings" preferably each comprise two or more strip photovoltaic elements arranged substantially in parallel to each other. Preferably the two or more strip photovoltaic elements are arranged substantially perpendicular to the "strings". Preferably the photovoltaic element comprises two or more "strings". Preferably, the two or more "strings" are arranged substantially parallel to each other. Each "string" preferably comprises a series of strip photovoltaic elements arranged in parallel to each other. Preferably the "strings" are arranged substantially parallel to the longest edge of photovoltaic portion, and the strips are arranged substantially parallel to the shortest edge of the photovoltaic portion. Preferably the "strings" further comprise one or more conductive electrodes in electrical connection with each strip photovoltaic element in the string. A strip photovoltaic element suitable for use in the present invention comprising strings is described in U.S. Pat. No. 8,766,086 B2, the description of which is herein incorporated by reference.

Alternatively, the photovoltaic element may preferably comprise three or more strip photovoltaic elements; or even more preferably a series of strip photovoltaic elements to provide the required overall transparency of the photovoltaic portion.

The strip photovoltaic elements are preferably of a thickness of from 0.4 to 0.6 mm. In addition, the strip photovoltaic elements may be preferably located between two or more interlayer sheets. Such interlayer sheets are preferably of a thickness of from 0.4 to 0.6 mm. The interlayer sheets preferably comprise a polymeric material. Suitable polymeric materials may be selected from one or more of, but not limited to: polyvinyl butyral (PVB); ethylene-vinyl acetate (EVA), a cast-in place resin; or another suitable interlayer material.

Also, in relation to the first aspect of the present invention, when the photovoltaic portion comprises one or strip photovoltaic elements, said strip photovoltaic element may comprise a partially transparent bi-facial crystalline silicon photovoltaic element, that is, selected regions of the photovoltaic element are substantially transparent to light and other selected regions are substantially opaque to light. The bi-facial crystalline silicon photovoltaic element preferably comprises a series of strips. A suitable photovoltaic element example for use in relation to the first aspect of the present invention comprises Solaria Powerduo™, available from Solaria Corporation, Fremont, Calif., USA.

Preferably, the reflecting element is located within the cavity. Preferably, the reflecting element is secured within the cavity. Suitable securing means may include, for example, strings and fixings as known in the art and as described by U.S. Pat. No. 9,080,376 B2, herein incorporated by reference.

Preferably, the reflecting element comprises an adjustable transparency reflecting element. The transparency of the adjustable transparency reflecting element is preferably adjustable following installation in the multifunctional glazing unit.

Also, the reflecting element may be provided with dyes or other means to improve the aesthetic appearance or colour neutrality. The transparency of the reflecting element is defined by the ability of the reflecting element to reflect a first proportion of light incident upon the reflecting element and to transmit a second proportion of light incident upon the reflecting element. Preferably, the reflecting element may be adjusted to greater than or equal to 50% transparency. More preferably, the reflecting element may be adjusted to greater than or equal to 70% transparency. Even more preferably, the reflecting element may be adjusted to greater than or equal to 90% transparency. Also, the reflecting element may preferably be adjusted to less than or equal to 50% transparency. More preferably, the reflecting element may be adjusted to less than or equal to 30% transparency. Even more preferably, the reflecting element may be adjusted to less than or equal to 10% transparency.

It may also be preferable that, the proportion of light absorbed by the reflecting element is minimised. Preferably the proportion of light absorbed by the reflecting element is less than the proportion of light reflected by the reflecting element.

Also for the first aspect of the present invention, the reflecting element preferably comprises one or more of: a roller blind; an electrochromic element; a photochromic element; a switchable mirror; one or more slats; or a combination thereof.

In addition, the one or more slats preferably comprise metal. The one or more slats may preferably comprise hardened aluminium alloy; preferably an aluminium magnesium alloy. Preferably, the one or more slats comprise from 4 to 5 weight % magnesium. Smaller percentages of other metallic or non-metallic elements such as, for example, but not limited to, copper, iron, nickel, silicon, phosphorus may also be present. Preferably, the one or more slats comprise two elongate surfaces. The one or more slats are preferably of a thickness in the region of 0.2 mm. Preferably, the one or more slats are formed by moulding a rolled strip of metal. Suitable slats for use in connection with the present invention are described in U.S. Pat. No. 9,080, 376 B2, details of which are incorporated herein by reference.

Preferably, the one or more slats comprises a first coating. In addition, the first coating preferably comprises a reflective coating.

Preferably, a portion of a surface of the one or more slats comprises the reflective coating. Alternatively, the one or more slats may comprise the reflective coating on both surfaces. Preferably, the reflectance of the slats is greater than 85%; more preferably greater than 90%, of the total incident solar radiation. Preferably, the reflectance is greater than 90% in the infrared spectral region; more preferably greater than 95%.

Preferably, the reflective coating comprises one or more coating layers. Preferably, one of the one or more coating layers is applied by sputtering. Preferably, one of the one or more coating layers comprises aluminium. Preferably, one of the one or more coating layers comprises at least 90 weight % aluminium; more preferably at least 95 weight % aluminium; yet more preferably at least 98 weight % aluminium. Even more preferably one of the one or more coating layers consists of aluminium.

The coating layer comprising aluminium is preferably of thickness from 75 nm to 260 nm; more preferably from 140 nm to 250 nm. A thicker coating layer comprising aluminium may be associated with a reduced degree of diffusivity, due to a reduction in slat surface roughness. A thinner coating layer comprising aluminium may be associated with a reduced degree of reflectance and reduced coating cohesion.

Preferably, the reflective coating may comprise, in order from the one or more slats a coating layer comprising aluminium and a first dielectric layer. Preferably, the reflective coating further comprises a second dielectric layer. Preferably, the second dielectric layer comprises a different chemical composition to that of the first dielectric layer. The reflective coating may further comprise a third or more dielectric layers. Preferably, the first and second dielectric layers are designed to generate constructive interference with respect to the reflected radiation, to increase the degree of incident radiation reflected.

Preferably, the reflective coating comprises a first dielectric layer of silicon dioxide and a second dielectric layer of titanium dioxide. Preferably, the first dielectric layer comprises silicon dioxide of thickness from 104 nm to 110 nm. Preferably, the second dielectric layer comprises titanium dioxide of thickness from 16 nm to 22 nm. Alternatively, the reflective coating may comprise a first dielectric layer of titanium dioxide and a second dielectric layer of silicon dioxide, and a third dielectric layer of titanium dioxide. Such an alternative coating stack preferably comprises a first dielectric layer of titanium dioxide of thickness from 3 nm to 6 nm; a second dielectric layer of silicon dioxide of thickness from 96 nm to 97 nm; and a third dielectric layer of thickness from 28 nm to 30 nm.

Alternatively, the reflective coating may comprise a first dielectric layer of silicon dioxide and a second dielectric layer of aluminium oxide. Such an alternative reflective coating preferably comprises a first dielectric layer of silicon dioxide of thickness from 80 nm to 110 nm; and a second dielectric layer of aluminium oxide of thickness from 40 nm to 60 nm.

Preferably the one or more slats are arranged with their longest axis substantially parallel to the second face of the second glazing pane.

The surface of the one or more slats is preferably roughened. Such roughness may serve to increase the adhesion of any coatings to the slats, and also increases the diffusivity of reflected light. The surface roughness is preferably from 100 nm to 850 nm; more preferably 400 nm to 600 nm. An increased surface roughness may also be associated with reduced coating homogeneity, while a decreased surface roughness may be associated with reduced diffusivity of reflected light and reduced coating adhesion.

Preferably, a portion of the surface of the one or more slats may be provided with a concave area. Such a concave area may concentrate reflected light onto the photovoltaic element. Such concentration may increase the efficiency of the photovoltaic element. Alternatively, such concentration may, when used with two or more parallel strip photovoltaic elements, allow the pitch of the strip elements to be increased. This may also serve to reduce the visibility of the photovoltaic element while maintaining the power output of the photovoltaic element. A slat with a portion of its surface provided with a concave area may be provided by moulding, rolling or other suitable shaping methods.

In addition, the one or more slats may be preferably provided with rotating means for adjusting the slats to increase or decrease the amount of light transmitted by the multifunctional glazing unit. Such means may include for example motors, rotors and levers.

Preferably, the photovoltaic element comprises one or more substantially parallel strip photovoltaic elements, the reflective element comprises one or more substantially parallel slats, and the one or more slats are substantially parallel to the one or more photovoltaic elements. Such an "aligned" arrangement may allow efficient absorption of reflected light by the photovoltaic element.

Where the multifunctional glazing comprises slats, and the slats are provided with rotating means for adjusting the slats, such rotating means may be preferentially provided with stops. Such stops are positions that the one or more slats may be preferentially rotated to, in order to reflect light onto the one or more photovoltaic elements rather than between the one or more photovoltaic elements. Therefore, such stops preferably allow for the focussing of reflected light upon the photovoltaic element, thereby increasing the efficiency of the photovoltaic element. Such stops may, for example, comprise mechanical mechanisms such as physical slots or spring mechanisms. Alternatively, the stops may be controlled by an electrical system. Preferably, the rotating means is an electric motor, and the stops are controlled by an electrical controller. Preferably, the electrical controller monitors the power output of the photovoltaic element and may automatically rotate the slats of the reflecting element to maximise the power output of the photovoltaic element. Preferably, such automatic adjustment made by the reflecting element alters the transparency of the reflecting element by less than 15%; more preferably less than 10%; even more preferably less than 5%.

In addition, where there is a series of slats, the multifunctional glazing unit may be preferably provided with a means for collecting the slats to increase the amount of light transmitted by the multifunctional glazing unit. Preferably, the slats are collected at an edge of the cavity. Such collecting means may include for example, but is not limited to: motors, rotors, pull cords and levers.

Also in respect to the first aspect of the present invention, the multifunctional glazing unit may further comprise a third sheet of glazing material comprising a first face and a second face; and wherein the third sheet of glazing material in positioned between the first and second sheets of glazing material. Preferably, the first face of the third sheet of glazing material faces towards the first sheet of glazing material; and the second face of the third sheet of glazing material faces towards the second sheet of glazing material.

Preferably, the third sheet of glazing material bisects the cavity to form a first cavity portion and a second cavity portion. As such, preferably the third sheet of glazing material comprises an intra-cavity glazing sheet.

It is preferred that, where the third sheet of glazing material comprises an intra-cavity glazing sheet, further intra-cavity glazing sheets of glazing material may be envisaged, producing a third, a fourth, a fifth, or more cavity portions respectively. The intra-cavity glazing sheet may be adjacent to the photovoltaic element. Also, the photovoltaic element may be adhered to the intra-cavity glazing sheet. However, it is preferred that the photovoltaic element is located between the first sheet of glazing material and the intra-cavity glazing sheet. It is preferred that the photovoltaic element is adjacent to the first sheet of glazing material. It is preferred that the photovoltaic element is adhered to the first sheet of glazing material.

Where the multifunctional glazing unit is provided with one or more intra-cavity glazing sheets, it is preferred that the reflecting element may be preferably provided within the cavity portion closest to the photovoltaic element. This preferably reduces the number of glazing sheets that may transmit the light to be reflected by the reflecting element and absorbed by the second face of the bifacial photovoltaic element, thereby increasing the efficiency of the photovoltaic element.

The multifunctional glazing unit may comprise a laminated glazing sheet. Preferably, the multifunctional glazing unit comprises a laminated glazing sheet wherein a sheet of interlayer material is laminated between the first sheet of glazing material and the third sheet of glazing material.

Preferably the sheet of interlayer material comprises a polymeric material. Suitable polymeric materials may be selected from one or more of, but not limited to: polyvinyl butyral (PVB); ethylene-vinyl acetate (EVA), a cast-in place resin; or another suitable interlayer material. The interlayer sheet may preferably provide adhesion between the panes of glazing material and the photovoltaic element. Alternatively, the sheet of interlayer material may incorporate the photovoltaic element itself.

The multifunctional glazing unit may further comprise a laminated glazing sheet and an intra-cavity sheet of glazing material.

Preferably, the photovoltaic element is positioned between the first sheet of glazing material and the third sheet of glazing material. Preferably, the reflecting element is positioned between the first sheet of glazing material and the third sheet of glazing material.

Preferably, the photovoltaic element is incorporated within a laminate. When the photovoltaic element is incorporated within such a laminate, the photovoltaic element may be more readily protected from damage during manufacture. Preferably, the laminate comprises a first sheet of interlayer material and a second sheet of interlayer material. Preferably, the laminate comprises, in order: the first sheet of glazing material; the first sheet of interlayer material; the photovoltaic element; the second sheet of interlayer material; the third sheet of glazing material. Alternatively, the photovoltaic element may be incorporated into a single interlayer sheet as this may reduce the thickness of the laminated unit.

Preferably a portion of a surface of the first, second or third sheet of glazing materials comprises a coating; preferably a functional coating. Examples of functional coatings include, for example, conductive coatings, infra-red radiation reflective/absorption coatings, self-cleaning coatings, non-marking coatings, and/or UV reflective/absorption coatings.

A portion of the surface of the second face of the first sheet of glazing material is preferably provided with a conductive coating for the collection of current from the photovoltaic element. Alternatively, where the photovoltaic element is laminated between the third sheet of glazing material and the first sheet of glazing material, a portion of the first face of the third sheet of glazing material may preferably comprise a conductive coating for the collection of current from the photovoltaic element. Such a conductive coating may be adapted for carrying electrical charge from the photovoltaic element to an external circuit. Preferably, the conductive coating is selected from one or more of: a transparent conductive oxide (TCO); a conductive frit; or a conductive ink. Preferably, the conductive coating comprises a TCO. Preferably, the conductive coating comprises a TCO comprising tin oxide. More preferably the TCO comprises fluorine-doped tin oxide or antimony-doped tin oxide. A suitable example TCO coating for use in accordance with the first aspect of the present invention comprises Pilkington TEC™. A suitable example conductive frit for use in accordance with the first aspect of the present invention comprises Solaria PowerFrit™. Preferably, the conductive ink comprises conductive carbon particles, such as, but not limited to, graphite. A suitable example conductive ink for use in accordance with the first aspect of the present invention comprises Henkel ELECTRODAG™ inks.

Preferably, one or both of the first and second faces of the third sheet of glazing material further comprises a second coating. Preferably, the second coating comprises a solar control coating.

A portion of a surface of the first, second or third sheet of glazing materials may comprise a solar control coating. Preferably, the solar control coating comprises a transparent conductive oxide (TCO), or silver. The thickness of the solar control coating may be adjusted to provide specific solar control and light transmittance properties. In addition, individual layers within a multi-layered stack may be similarly adjusted, for example to achieve colour neutrality. A suitable solar control coated glazing example for use in accordance with the first aspect of the present invention is Pilkington K™, available from Nippon Sheet Glass Co., Ltd.

Preferably, the second face of the second sheet of glazing material further comprises a third coating. Preferably, the third coating comprises a heatable coating.

The second face of the second sheet of glazing material may be preferably provided with a coating; more preferably a functional coating. Preferably the functional coating is a heatable coating. Preferably the heatable coating comprises a transparent conductive oxide (TCO). More preferably the heatable coating comprises a TCO comprising tin oxide. Most preferably the heatable coating comprises a TCO comprising fluorine-doped tin oxide. Such a heatable coating may be adapted for increasing the temperature of the second sheet of glazing material, thereby reducing the incidence of condensation on the multifunctional glazing unit. A suitable example of a TCO coated glass for use in accordance with the first aspect of the present invention includes NSG TEC™, available from Nippon Sheet Glass Co., Ltd.

Preferably, one or both of the first faces of the first or second sheets of glazing material further comprise a fourth coating. Preferably, the fourth coating is a self-cleaning coating.

Preferably, the first face of the first sheet of glazing material or the first face of the second sheet of glazing material is provided with a coating; more preferably a functional coating. Preferably the functional coating comprises one or more of: a self-cleaning coating; an anti-reflection coating; a non-marking coating.

Preferably, where the functional coating comprises a self-cleaning coating, the self-cleaning coating comprises titanium dioxide, $TiO_2$; preferably $TiO_2$ with a predominantly anatase crystal structure. A suitable example of a self-cleaning coated glass for use in accordance with the first aspect of the present invention is Pilkington Activ™, available from Nippon Sheet Glass Co., Ltd. The self-cleaning coating may be manufactured as described by U.S. Pat. No. 6,238,738 B1, the details of which are incorporated herein by reference.

Preferably, where the functional coating is an anti-reflection coating, the anti-reflection coating comprises a first dielectric layer and a second dielectric layer. A suitable anti-reflection coated glass example for use in accordance with the first aspect of the present invention is Pilkington Optiview™, available from Nippon Sheet Glass Co., Ltd. The anti-reflection coating may be manufactured as described by U.S. Pat. No. 5,935,716 A, the details of which are incorporated herein by reference.

One or more of the coatings may be applied for example by chemical vapour deposition (CVD). This method may allow a large surface area to be coated at a high rate. Alternatively, one or more of the coatings may be applied by physical vapour deposition, such as sputtering. Physical vapour deposition (PVD) may be used to deposit coating compositions which are preferably deposited by PVD. Alternatively, one or more of the coatings may be applied by liquid deposition techniques such as, for example, slot-die, doctor blade, spray or roller coating. Liquid deposition techniques may be used to deposit coating compositions in place of CVD or PVD techniques as required.

Whilst the sheets of glazing material preferably comprise glass, alternative glazing materials may comprise resin, such as a polycarbonate resin. A glazing material which comprises resin may provide increased impact resistance. However, it is more preferred that the sheets of glazing material comprise glass. Most preferably glass glazing material provides a scratch resistant surface. Preferably the glazing material comprises soda-lime-silica glass. Preferably, the first sheet of glazing material, and/or the third sheet of glazing material, and/or the second sheet of glazing material, comprise low-iron soda-lime-silica glass. Most preferably, the first sheet of glazing material comprises low-iron soda-lime-silica glass. Low-iron soda-lime-silica glass preferably comprises 1 weight % or less iron. More preferably the low-iron soda-lime silica glass comprises 0.1 weight % or less iron. Most preferably, the low-iron soda-lime silica glass comprises 0.03 weight % or less iron. An example of a suitable low-iron soda-lime-silica glass for use in accordance with the first aspect of the present invention is Pilkington Optiwhite™ available from Nippon Sheet Glass Co., Ltd. The use of a low-iron glass preferably reduces the amount of solar energy absorbed by the glass and facilitates transmission of energy. Consequently, use of such low-iron glass may increase the efficiency of the photovoltaic element.

Preferably the cavity is a heat insulating cavity. In addition, the cavity may be preferably furnished with an insulating gas such as argon, or a vacuum. Each cavity portion may be provided with an insulating gas, which may be the same or different. The glazing unit is provided with a suitable means for maintaining the cavity, such as spacer bars. Such spacer bars may be of any suitable material.

The multifunctional glazing unit may further require seals. The seals may be both peripheral and internal, and may be used to, for example, prevent the ingress of moisture into the multifunctional glazing unit. Alternatively, such seals may be used to prevent the escape of insulating gas from the cavity; or release of vacuum from the cavity; or simply to retain glazing sheets within the multifunctional glazing unit.

The use of one or more spacer bars in the multifunctional glazing of the present invention may preferably maintain the cavity. Such one or more spacer bars may incorporate a means for adjusting the transparency of the reflecting element, and/or a means for forming a contact between the photovoltaic element and an external circuit. The one or more spacer bars may be preferably penetrated partially or completely by the sheets of glazing material, depending on the design of the multifunctional glazing unit.

Preferably the multifunctional glazing unit is an insulating glazing unit (IGU). Preferably the IGU comprises a U-value of less than or equal to 0.4; and a solar heat gain coefficient (SHGC) of less than or equal to 0.45. U-value is a measure of heat gain or loss through the multi-functional window assembly due to environmental differences between the outdoor and indoor air. A lower U-value means that less heat is lost from the building's interior to its exterior, resulting in savings in energy costs. SGHC is defined as the ratio of total solar heat gain through the multi-functional window assembly relative to the incident solar radiation.

The photovoltaic element used in accordance with the first aspect of the present invention preferably utilizes solar radiation which contacts the multifunctional glazing unit to create electrical energy. The multifunctional glazing unit assembly may preferably therefore also comprise electrical apparatus such as electrical leads, connectors, junction boxes and electrical controllers as known in the art. Such electrical apparatus may preferably be positioned within or at the multifunctional glazing unit edge, or within a spacer bar, to prevent a reduction in transparency of the multifunctional glazing unit, or a reduction in efficiency of the photovoltaic element.

According to a second aspect of the present invention there is provided a process for manufacturing a multifunctional glazing unit of the first aspect, comprising the steps of:
i) providing a first sheet of glazing material and a second sheet of glazing material;
ii) providing one or more spacer bars;
iii) separating the first sheet of glazing material and the second sheet of glazing material with the one or more spacer bars to provide a cavity; and
iv) positioning a photovoltaic portion and a reflecting element between the first sheet of glazing material and the second sheet of glazing material to form the multifunctional glazing unit,
wherein the photovoltaic portion comprises: a transparent region; a bi-facial region; and at least one photovoltaic element.

Preferably, the process further comprises the step of installing the multifunctional glazing unit into a building.

Preferably, the process for manufacturing a multifunctional glazing unit according to the second aspect of the present invention further comprises the step of installing the multifunctional glazing unit into an aperture within a building casing. A building comprises a building interior and a casing, the casing separating the building interior from the building environment. The multifunctional glazing unit may be incorporated into a window, door, rooflight, or other building product. Preferably the multifunctional glazing unit is arranged such that the first sheet of glazing material is disposed towards the building exterior and the second sheet of glazing material is disposed towards the building interior.

Preferably, the process for manufacturing a multifunctional glazing unit further comprises the steps of providing a third sheet of glazing material and laminating the photovoltaic element between the first sheet of glazing material and the third sheet of glazing material. Preferably, the laminating step is prior to providing the multifunctional glazing unit.

According to a third aspect of the present invention there is provided the use of the multifunctional glazing unit according to the first aspect to generate electricity.

According to a fourth aspect of the present invention there is provided the use of the multifunctional glazing unit of the first aspect in a building.

All features described above in relation to the first aspect of the present invention also apply accordingly in relation to the second, third and fourth aspects of the present invention.

BRIEF DESCRIPTION OF THE DRAWINGS

Embodiments of the present invention will now be described by way of example only with reference to the following accompanying drawings in which.

DETAILED DESCRIPTION OF THE INVENTION

Figure 1:
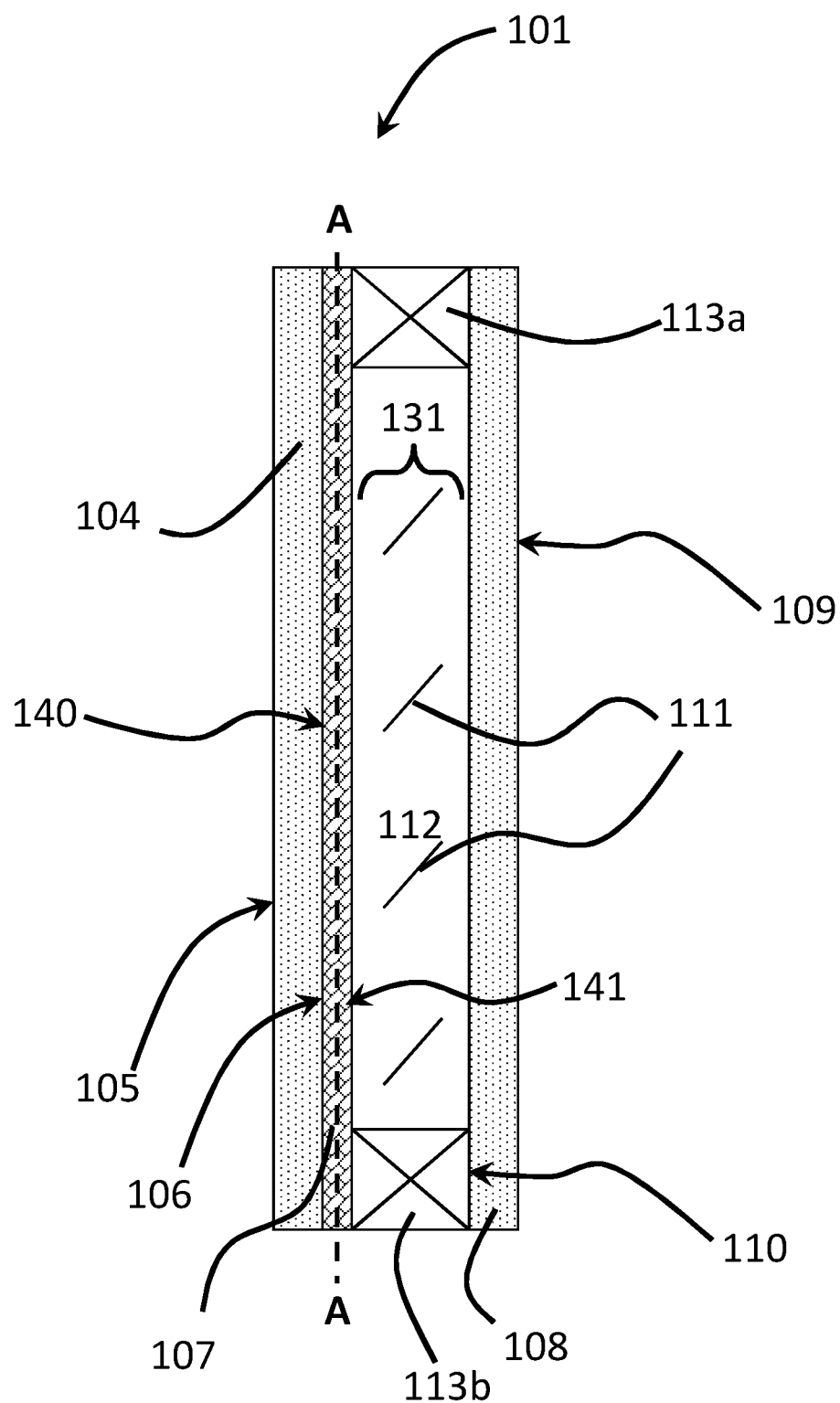
FIG. 1 illustrates a schematic cross-sectional view of a multi-functional glazing unit according to a first embodiment of the present invention.

FIG. 1 represents a schematic cross-sectional view of a first embodiment of a multifunctional glazing unit 101 according to the present invention.

The multifunctional glazing unit 101 comprises a photovoltaic portion 107 and a reflecting element 131.

The multifunctional glazing unit 101 comprises a first sheet of glazing material 104 with a first face 105 and a second face 106, and a second sheet of glazing material 108 with a first face 109 and a second face 110.

A cavity 112 is located between the first 104 and second 108 sheets of glazing material.

The reflecting element 131 and the photovoltaic portion 107 are positioned between the first sheet of glazing material 104 and the second sheet of glazing material 108. The photovoltaic portion 107 comprises a first face 140 and a second face 141.

In this first embodiment of the present invention, the cavity 112 is preferably defined by the second sheet of glazing material 108, the first sheet of glazing material 104, and spacer bars 113a and 113b. The cavity 112 is preferably provided with an insulating gas, such as argon.

The reflecting element 131 is preferably secured within the cavity 112. The reflecting element 131 is preferably a series of slats 111. The slats 111 may be formed from a metal, such as hardened aluminium alloy. The slats 111 may further comprise a reflecting coating on one or both surfaces. The slats 111 are preferably provided with suspension means, such as for example strings (not shown), for suspending the slats 111 within the cavity 112. The suspension means may also allow the slats to be rotated about their longest axis. This rotation allows the transparency of the reflecting element to be adjusted relative to light incident on the multifunctional glazing unit 101. The suspension means may also allow the slats 111 of the reflecting element 131 to be condensed, preferably at an edge of the cavity 112. The first 104 and second 108 sheets of glazing material are preferably formed from low-iron glass. Preferably, the first 104 and second 108 sheets of glazing material have a thickness of 6 mm. The second face 110 of the second sheet of glazing material 108 preferably further comprises a heatable coating.

The heatable coating preferably comprises fluorine-doped tin oxide. Preferably, one or both of the first faces 105, 109 of the first 104 and second 108 sheets of glazing material further comprise a self-cleaning coating. The self-cleaning coating preferably comprises titanium dioxide.

Figure 2:
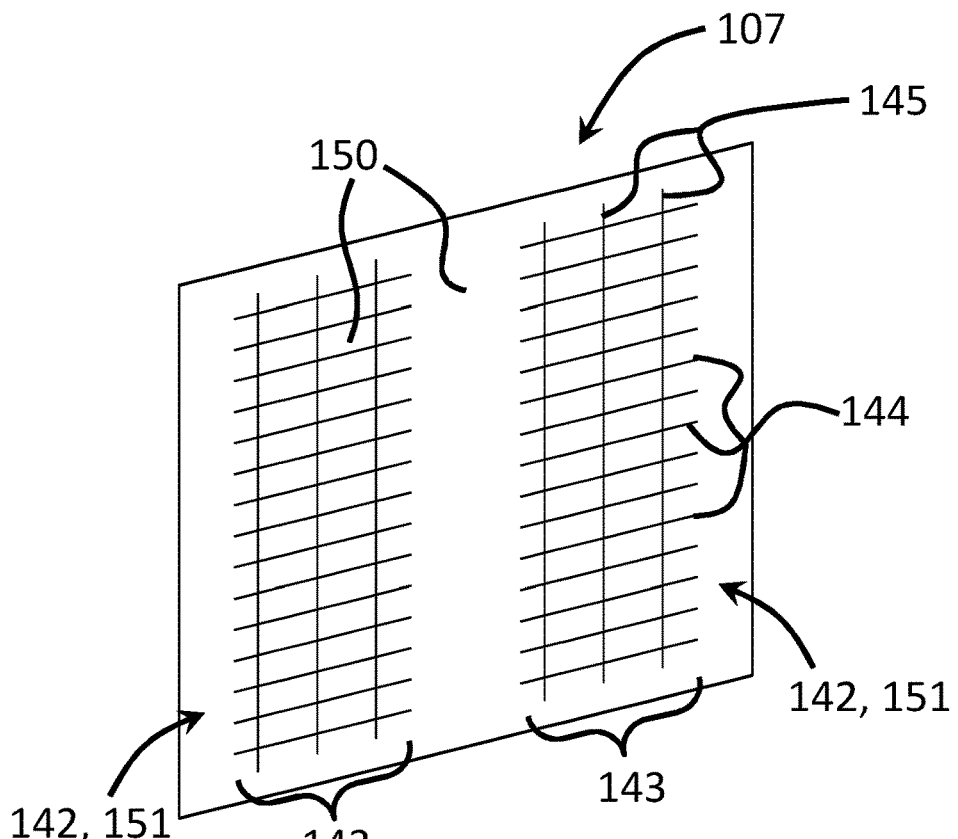
FIG. 2 illustrates a schematic cross-sectional view along line A-A of a photovoltaic portion of the multifunctional glazing unit according to the first embodiment of present invention depicted in FIG. 1.

FIG. 2 represents a schematic cross-sectional view along line A-A of a photovoltaic portion 107 of the first embodiment of the multifunctional glazing unit 101 according to the present invention.

The photovoltaic portion 107 comprises a transparent region 150, a bi-facial region 151 and a photovoltaic element 142. The photovoltaic portion 107 comprises a first face and a second face, as illustrated in FIG. 1. In this embodiment the photovoltaic portion 107 preferably comprises two or more photovoltaic elements 142, referred to herein as a "strings" 143. Each "string" preferably comprises a series of strips 144. Each strip is preferably provided with one or more photovoltaic cell (not shown) for the generation of electricity. Each "string" 143 is preferably provided with conductors 145 for electrically linking the strips 144. The two or more photovoltaic elements 142 are preferably laminated between a first sheet of interlayer material and a second sheet of interlayer material. The sheets of interlayer material preferably comprise polyvinyl butyral (PVB). The bifaciality factor of the photovoltaic portion 107 is preferably at least 75%. That is, the photovoltaic efficiency of the second face is preferably at least 75% of the photovoltaic efficiency of the first face. Preferably the photovoltaic efficiency of the first face is at least 6.5%, and the photovoltaic efficiency of the second face is at least 5.2%. In this embodiment the bi-facial region 151 is co-located with the photovoltaic element 142 which comprises the "string" 143.

Figure 3:
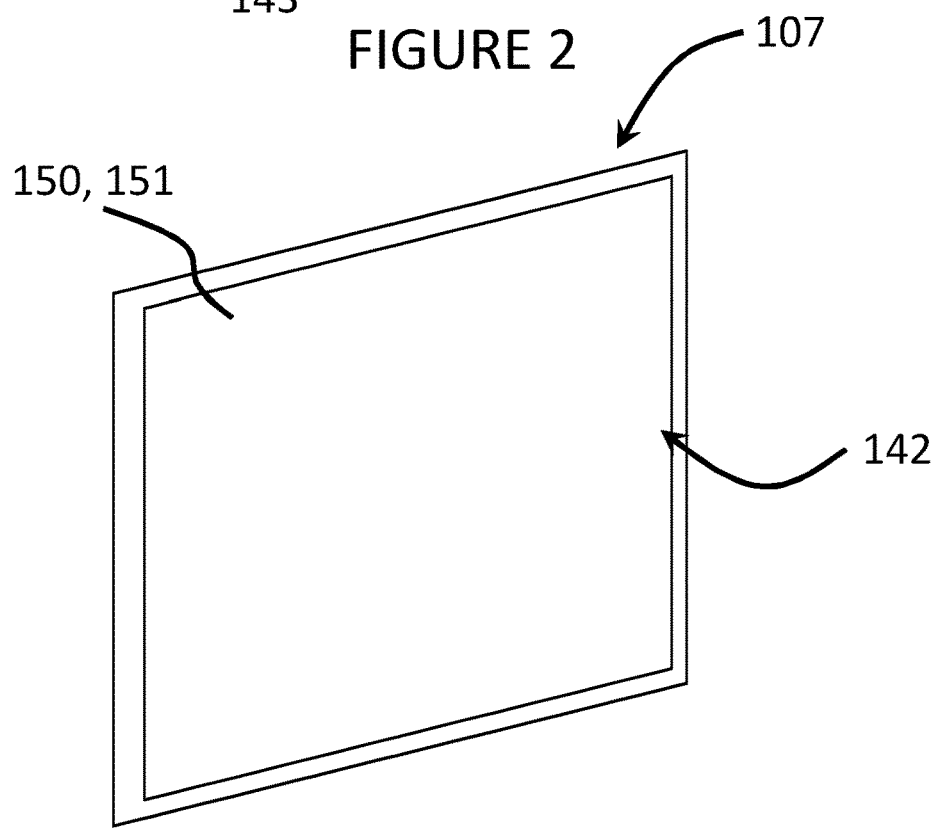
FIG. 3 illustrates a schematic cross-sectional view along line A-A of an alternative photovoltaic portion of the multifunctional glazing unit according to the first embodiment of present invention depicted in FIG. 1.

FIG. 3 represents a schematic cross-sectional view along line A-A of an alternative photovoltaic portion 107 of the first embodiment of the multifunctional glazing unit 101 according to the present invention.

The alternative photovoltaic portion 107 comprises a photovoltaic element 142 comprising a transparent region 150, and a bi-facial region 151. The photovoltaic portion 107 comprises a first face and a second face, as illustrated in FIG. 1. The bifaciality factor of the photovoltaic portion 107 is preferably at least 75%. That is, the photovoltaic efficiency of the second face is preferably at least 75% of the photovoltaic efficiency of the first face. Preferably the photovoltaic efficiency of the first face is at least 6.5% and the photovoltaic efficiency of the second face is at least 5.2%. Preferably, the photovoltaic element is a thin film photovoltaic element. The thin film photovoltaic element may be a perovskite photovoltaic element. The photovoltaic element may be provided with conductors for providing the generated electricity to an external circuit (not shown). In this embodiment the bi-facial region 151 is co-located with the photovoltaic element 142, and with the transparent region 150.

Figure 4:
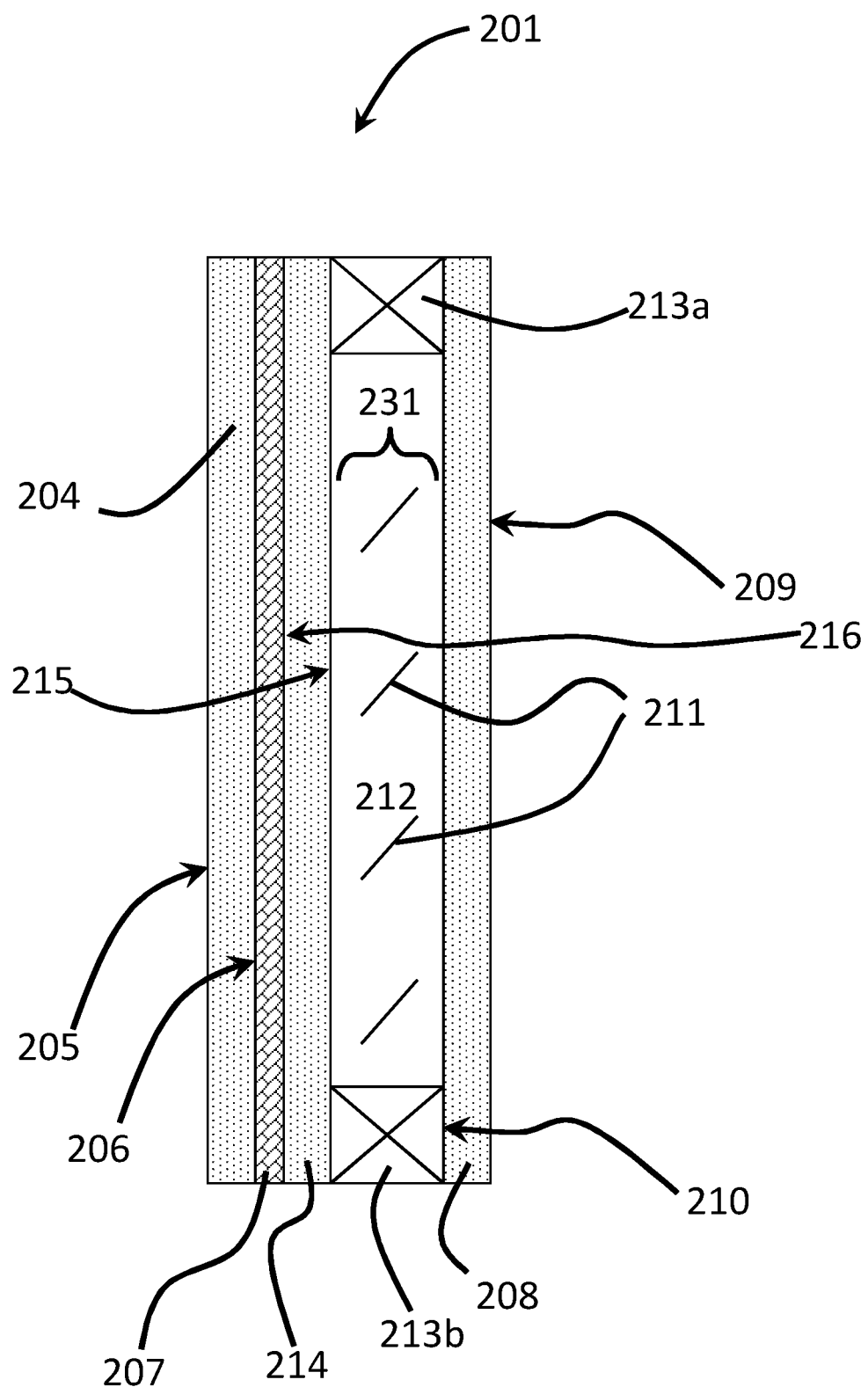
FIG. 4 illustrates a schematic cross-sectional view of a multi-functional glazing unit according to a second embodiment of the present invention.

FIG. 4 represents a schematic cross-sectional view of a second embodiment of a multifunctional glazing unit 201 according to the present invention.

The multifunctional glazing unit 201 comprises a photovoltaic portion 207 and a reflecting element 231.

The multifunctional glazing unit 201 comprises a first sheet of glazing material 204 with a first face 205 and a second face 206, and a second sheet of glazing material 208 with a first face 209 and a second face 210.

A cavity 212 is located between the first 204 and second 208 sheets of glazing material.

The reflecting element 231 and the photovoltaic portion 207 are positioned between the first sheet of glazing material 204 and the second sheet of glazing material 208.

In this second embodiment of the present invention the multifunctional glazing unit 201 also further comprises a third sheet of glazing material 214. The third sheet of glazing material 214 comprises a first face 215 and a second face 216.

The third sheet of glazing material 214 is in contact with the photovoltaic portion 207, and the photovoltaic portion 207 is in contact with the first sheet of glazing material 204. Preferably the photovoltaic portion 207, first sheet of glazing material 204, and third sheet of glazing material 214 form a laminated construction.

In this second embodiment of the present invention, the cavity 212 is preferably defined by the second sheet of glazing material 208, the third sheet of glazing material 214, and spacer bars 213a and 213b. The cavity 212 is preferably provided with an insulating gas, such as argon.

The reflecting element 231 is preferably secured within the cavity 212. The reflecting element 231 is preferably a series of slats 211. The slats 211 may be formed from a metal, such as hardened aluminium alloy. The slats 211 may further comprise a reflecting coating on one or both surfaces. The slats 211 are preferably provided with suspension means, such as strings (not shown) for suspending the slats 211 within the cavity 212. The suspension means may also allow the slats to be rotated about their longest axis. This rotation allows the transparency of the reflecting element to be adjusted relative to the light incident on the multifunctional glazing unit 201. The suspension means may also allow the slats of the reflecting element 211 to be condensed for example at an edge of the cavity 212, or in the region of the spacer bar 213a.

The first 204 and second 208 sheets of glazing material are preferably formed from low-iron glass. Preferably, the first 204 and second 208 sheets of glazing material have a thickness of 6 mm. The second face 210 of the second sheet of glazing material 208 preferably further comprises a heatable coating; the heatable coating preferably comprising fluorine-doped tin oxide. Preferably, one or both of the first faces 205, 209 of the first 204 and second 208 sheets of glazing material further comprise a self-cleaning coating; the self-cleaning coating preferably comprising titanium dioxide.

The multifunctional glazing unit 201 may comprise one or more photovoltaic portions 207 as described previously in relation to FIGS. 2 and 3 respectively.

Figure 5:
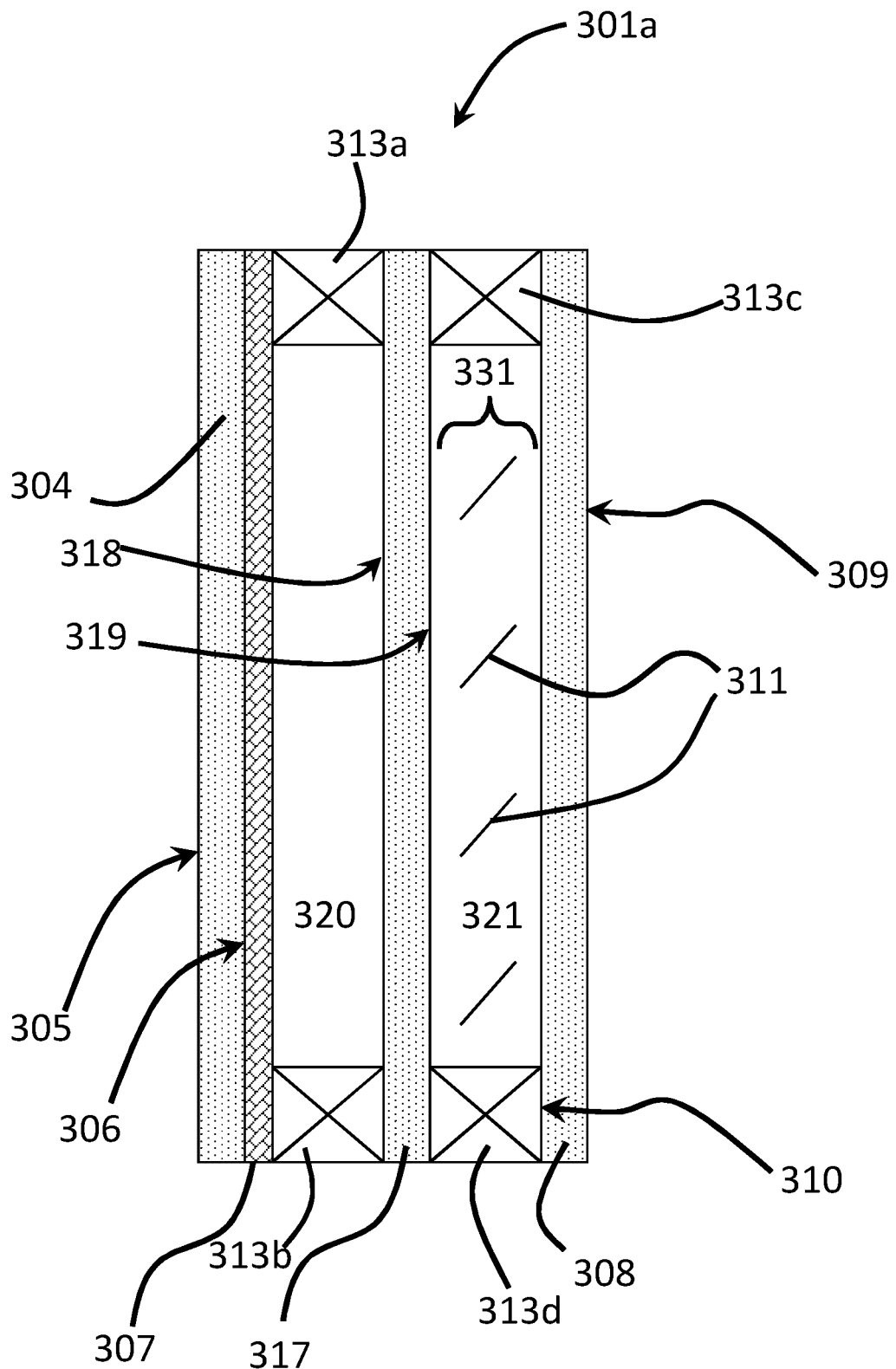
FIG. 5 illustrates a schematic cross-sectional view of a multi-functional glazing unit according to a third embodiment of the present invention.

FIG. 5 represents a schematic cross-sectional view of a third embodiment of a multifunctional glazing unit 301a according to the present invention.

The multifunctional glazing unit 301a comprises a photovoltaic portion 307 and a reflecting element 331. The multifunctional glazing unit 301a comprises a first sheet of glazing material 304 with a first face 305 and a second face 306, and a second sheet of glazing material 308 with a first face 309 and a second face 310.

A cavity is located between the first 304 and second 308 sheets of glazing material. The reflecting element 331 and the photovoltaic portion 307 are positioned between the first sheet of glazing material 304 and the second sheet of glazing material 308.

In this third embodiment of the present invention the multifunctional glazing unit 301a further comprises a third sheet of glazing material 317. The third sheet of glazing material 317 comprises a first face 318 and a second face 319. The third sheet of glazing material 317 bisects the cavity, forming a first cavity portion 320 and a second cavity portion 321.

In this third embodiment of the present invention, the first cavity portion 320 is preferably defined by the first sheet of glazing material 304, the third sheet of glazing material 317, and spacer bars 313a and 313b. The second cavity portion 321 is preferably defined by the second sheet of glazing material 308, the third sheet of glazing material 317, and spacer bars 313c and 313d. Preferably either the first cavity portion 320, the second cavity portion 321, or both are provided with insulating gas such as argon.

The reflecting element 331 is preferably secured within the second cavity portion 321. The reflecting element 331 is preferably a series of slats 311. The slats 311 may be formed from a metal, such as hardened aluminium alloy. The slats 311 may further comprise a reflecting coating on one or both surfaces. The slats 311 are preferably provided with suspension means, such as strings (not shown) for suspending the slats 311 within the cavity. The suspension means may also allow the slats 311 to be rotated about their longest axis. This rotation allows the transparency of the multifunctional glazing unit 301a to be adjusted relative to the light incident on the multifunctional glazing unit. The suspension means may also allow the slats 311 of the reflecting element 331 to be condensed towards spacer 313c for example, or at an edge of the second cavity portion 321.

The first 304 and second 308 sheets of glazing material are preferably formed from low-iron glass. Preferably, the first 304 and second 308 sheets of glazing material have a thickness of 6 mm. Preferably, the third sheet of glazing material 317 is formed from low-iron glass. Preferably, the third sheet of glazing material 317 has a thickness of 6 mm. The second face 310 of the second sheet of glazing material 308 preferably further comprises a heatable coating; the heatable coating preferably comprising fluorine-doped tin oxide. Preferably, one or both of the first faces 305, 309 of the first 304 and second 308 sheets of glazing material further comprise a self-cleaning coating; the self-cleaning coating preferably comprising titanium dioxide.

The multifunctional glazing unit 301a may further comprise photovoltaic portions as described above in relation to FIGS. 2 and 3.

Figure 6:
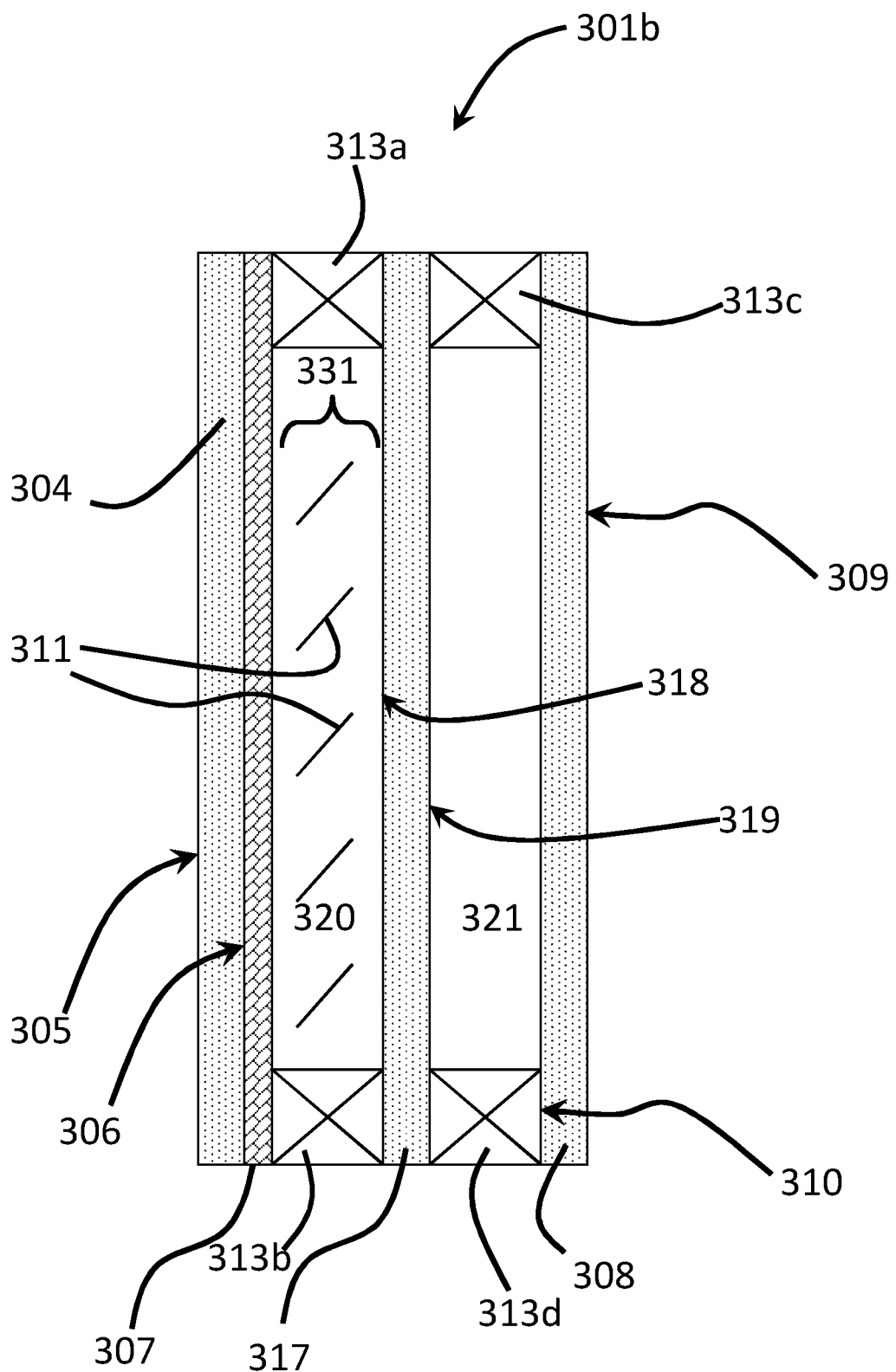
FIG. 6 illustrates a schematic cross-sectional view of a multi-functional glazing unit according to an alternative third embodiment of the present invention.

FIG. 6 represents a schematic cross-sectional view of an alternative third embodiment of the multifunctional glazing unit 301b according to the present invention.

In this alternative third embodiment of the multifunctional glazing unit 301b according to the present invention the reflecting element 331 is secured in the first cavity portion 320. This arrangement provides the advantage of reducing the number of intervening panes between the reflecting element 331 and the photovoltaic portion 307, thereby reducing the amount of light absorbed by such intervening panes and thus increasing the potential energy generation efficiency of the multifunctional glazing unit 301b.

Further features present in FIG. 6 are as described above in relation to FIG. 5.

Figure 7:
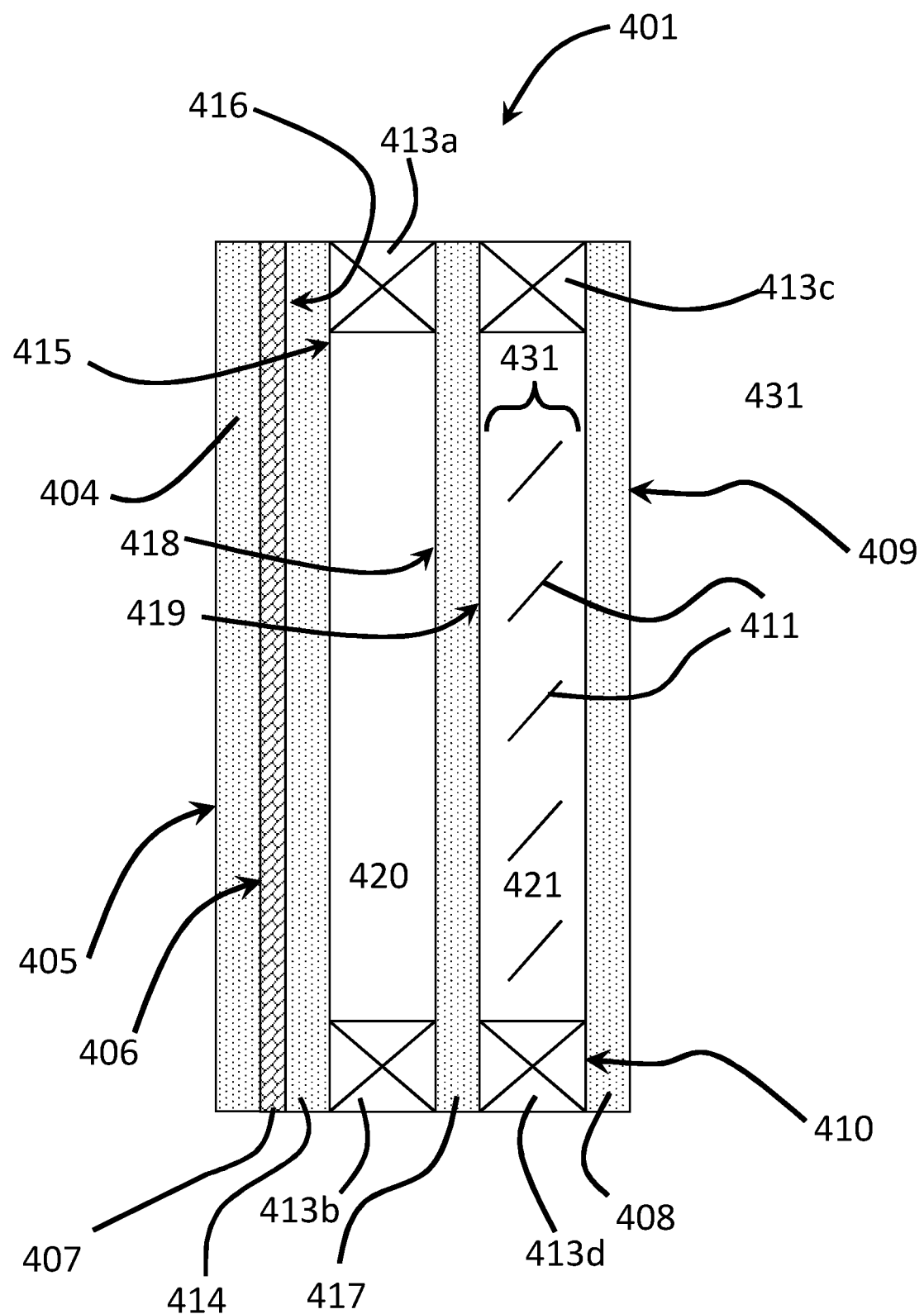
FIG. 7 illustrates a schematic cross-sectional view of a multi-functional glazing unit according to a fourth embodiment of the present invention.

FIG. 7 represents a schematic cross-sectional view of a fourth embodiment of the multifunctional glazing unit 401 according to the present invention.

The multifunctional glazing unit 401 comprises a photovoltaic portion 407 and a reflecting element 431. The multifunctional glazing unit 401 comprises a first sheet of glazing material 404 with a first face 405 and a second face 406, and a second sheet of glazing material 408 with a first face 409 and a second face 410. A cavity is located between the first 404 and second 408 sheets of glazing material.

The reflecting element 431 and the photovoltaic portion 407 are positioned between the first sheet of glazing material 404 and the second sheet of glazing material 408.

In this fourth embodiment of the present invention the multifunctional glazing unit 401 further comprises a third sheet of glazing material 414. The third sheet of glazing material 414 comprises a first face 415 and a second face 416.

The third sheet of glazing material 414 is in contact with the photovoltaic portion 407, and the photovoltaic portion 407 is in contact with the first sheet of glazing material 404. Preferably the photovoltaic portion 407, first sheet of glazing material 404, and third sheet of glazing material 414 form a laminated construction.

In this fourth embodiment of the present invention the multifunctional glazing unit 401 further comprises a fourth sheet of glazing material 417. The fourth sheet of glazing material 417 comprises a first face 418 and a second face 419. The fourth sheet of glazing material 417 bisects the cavity, forming a first cavity portion 420 and a second cavity portion 421.

In this fourth embodiment of the present invention, the first cavity portion 420 is preferably defined by the third sheet of glazing material 414, the fourth sheet of glazing material 417, and spacer bars 413a and 413b. The second cavity portion 421 is preferably defined by the second sheet of glazing material 408, the fourth sheet of glazing material 417, and spacer bars 413c and 413d. Preferably the first cavity portion 420, the second cavity portion 421, or both are provided with insulating gas such as argon.

The reflecting element 431 is preferably secured within the second cavity portion 421. Alternatively, the reflecting element 431 may be secured within the first cavity portion 420 in a similar manner to that described in FIG. 5. The reflecting element 431 is preferably a series of slats 411. The slats 411 may be formed from a metal, such as hardened aluminium alloy. The slats 411 may further comprise a reflecting coating on one or both surfaces. The slats 411 are preferably provided with suspension means, such as strings (not shown) for suspending the slats 411 within the cavity. The suspension means may also allow the slats 411 to be rotated about their longest axis. This rotation allows the transparency of the multifunctional glazing unit 401 to be adjusted relative to the light incident on the multifunctional glazing unit 401. The suspension means may also allow the slats 411 of the reflecting element 431 to be condensed at an edge of the cavity, or in a region adjacent to a spacer bar.

The first 404 and second 408 sheets of glazing material are preferably formed from low-iron glass. Preferably, the first 404 and second 408 sheets of glazing material have a thickness of 6 mm. The second face 410 of the second sheet of glazing material 408 preferably further comprises a heatable coating; the heatable coating preferably comprising fluorine-doped tin oxide. Preferably, one or both of the first faces 405, 409 of the first 404 and second 408 sheets of glazing material further comprise a self-cleaning coating; the self-cleaning coating preferably comprising titanium dioxide.

The multifunctional glazing unit 401 may comprise photovoltaic portions 407 as described above in relation to FIGS. 2 and 3.

As used herein with reference to each of the embodiments in FIGS. 1 to 7, the term bifacial photovoltaic element describes a photovoltaic element formed as a plane with a first face and a second face, wherein the photovoltaic element is capable of absorbing light incident upon both the first face and the second face. Preferably the bi-facial photovoltaic element has a bi-faciality factor of greater than or equal to 50%; more preferably greater than or equal to 75%. The bi-faciality factor is defined herein as the power output of the least efficient face compared, under identical test conditions, to the power output of the most efficient face, as a percentage.

An example glazing unit was prepared to assess the potential advantages of the invention. The example glazing unit comprises a partially transparent photovoltaic module of 102×154 cm$^2$ formed from two sheets of glazing material with a 'string-form' photovoltaic cell (such as PowerVision™, available from Solaria Oakland, Calif., USA) laminated therebetween. The 'string-form' photovoltaic cell comprises a number of photovoltaic strips and allows in the region of 50% of the light incident upon the photovoltaic module to pass through. The example glazing unit is not a bi-facial photovoltaic module in order to ensure that the power output of the rear face of a bi-facial analogue may be accurately assessed.

The example glazing unit was tested using a commercially available flash gun light source that produces repeatable amounts of light (such as Speedlite EL-100, available from Canon, Japan). The light source was supported on a stand at a set position from the glazing unit such that a light beam formed by the light source strikes the centre of the glazing unit at an angle perpendicular to each face of the glass sheets (0° incidence). The power output of the tested glazing unit during illumination with the flash gun was measured.

To provide a reference power output the example glazing unit was placed in a holder orientated with the active face of the photovoltaic module towards the light source. As used herein, the term "active face" is used to indicate the face of the photovoltaic module capable of absorbing light. The maximum power output of the glazing unit when facing towards the light source was 115 W.

Measurements of the bi-facial effectiveness of different reflecting elements and different distances between the reflecting elements and the photovoltaic module were made by the following method: the photovoltaic module was placed in the holder orientated with the active face of the photovoltaic module facing away from the light source and with a reflecting element behind the photovoltaic module, such that light passing through the glazing unit may be reflected by the reflecting element on to the photovoltaic module, and the light source activated while the power output of the photovoltaic module was monitored. The maximum power output of each example glazing unit was recorded.

Three different reflecting element materials were tested, and the distance between the reflecting element and the photovoltaic module was varied. The different reflecting element materials were a black cloth, aluminium foil, and a grey, aluminium slatted blind (Screenline®, available from Pellini, Italy).

| Reflecting element Material | Distance between reflecting element and photovoltaic module (mm) | Maximum Power Output (W) | Power compared with direct irradiation (%) |
|---|---|---|---|
| Black Cloth | 0 | 7.0 | 6.1 |
| Aluminium Foil | 0 | 31.0 | 27.0 |
| Aluminium Foil | 15 | 38.5 | 33.5 |
| Aluminium Foil | 40 | 47.4 | 41.2 |
| Slatted Blind | 0 | 24.5 | 21.3 |
| Slatted Blind | 15 | 24.7 | 21.5 |

The slatted blind is an example of a reflecting element which comprises an adjustable transparency.

In the examples where the distance between the reflecting element and photovoltaic module was recorded as 0 mm, the reflecting element was in direct contact with the photovoltaic module.

A black cloth was used as a reflecting element to measure the power output in the case of a high absorption reflecting element. The measurement of the example comprising a black cloth indicated that scattering and internal reflections within the glass surfaces was responsible for around 7.0 W of power output in this experimental apparatus.

An aluminium foil was used as a reflecting element to measure the effect of a low absorption reflecting element. For the aluminium foil, a strong dependence between the increasing distance and increasing the maximum power generated is observed. This is due to the angle of incidence in this experiment being 0°, causing a large proportion of the incident light to be reflected back through the photovoltaic module, between the strip photovoltaic elements. An increase in distance allows light scattering by the aluminium foil to have an increased effect, causing the reflection to become less specular in nature. The less specular (that is, more diffuse) the reflection by the reflecting element, the less sensitive the unit will be to the angle of incident light.

The power output when aluminium foil was used as a reflecting element tended towards 50%. Whilst not wishing to be bound by any particular theory, it is reasonable to conclude that the theoretical maximum power compared with direct irradiation for this testing scenario is 50%. Half of the incident light is absorbed by the photovoltaic module, and the other half is transmitted by the photovoltaic module and available to be reflected. Following reflection, half of the reflected light is absorbed by the photovoltaic module, and the other half transmitted back towards the light source. Therefore, even in the case of a perfect reflecting element, power output by the face of the photovoltaic module facing away from the light source may only be half of the equivalent face facing towards the light source (50% power output).

The slatted blind examples produce a power output lower than the aluminium foil examples, but each provides a useful increase in power output. While the slatted blind provides a lower power output that aluminium foil, it allows the passage of light through the photovoltaic module, allowing the glazing unit to transmit light to a building interior. The power output for the slatted blind example is much less sensitive to reflecting element distance, this may be due to the non-uniform shape of the slatted blind, and because the reflection is more diffuse. In relation to the present invention as described above, the inventors have surprisingly discovered that a multifunctional glazing unit prepared by the addition of a reflecting element to a photovoltaic element provides a surprising improvement in the efficiency of the photovoltaic element. Additionally, a reflecting element with an adjustable transparency provides an improved ability to regulate the light transmission of the window assembly. This also allows ready control of the temperature within a room associated with the multifunctional glazing unit, while maintaining heat insulating properties of the unit. The improvement in photovoltaic element efficiency is believed to be due to the transmission by the photovoltaic portion and subsequent reflection by the reflecting element of light useful for the generation of electricity.

The invention claimed is:

1. A multifunctional glazing unit comprising:
   a first sheet of glazing material comprising a first face and a second face;
   a second sheet of glazing material comprising a first face and a second face;
   a photovoltaic portion; and
   a reflecting element;
   wherein the first sheet of glazing material and the second sheet of glazing material are separated by a cavity that is a heat insulating cavity sealed by at least one spacer bar; and wherein the second faces of each sheet of glazing material face towards the cavity; and wherein the photovoltaic portion and the reflecting element are each positioned between the first sheet of glazing material and the second sheet of glazing material and the reflecting element is spaced apart from the second sheet of glazing material;
   wherein the photovoltaic portion in direct contacts with the first sheet of glazing material;
   wherein the photovoltaic portion comprises a transparent region, a bi-facial region, and at least one photovoltaic element;
   wherein the reflecting element comprises an adjustable transparency reflecting element; and
   wherein the reflecting element comprises a plurality of rotatable slats.

2. The multifunctional glazing unit according to claim 1, wherein the photovoltaic portion comprises a first region with a first transparency value and a second region with a second transparency value; and wherein the first transparency value is greater than the second transparency value.

3. The multifunctional glazing unit according to claim 1, wherein the photovoltaic element comprises one or more of:

a thin film photovoltaic element; a silicon photovoltaic element; a cadmium telluride photovoltaic element; a perovskite photovoltaic element; one or more strip photovoltaic elements; or a combination thereof.

4. The multifunctional glazing unit according to claim 3, wherein the photovoltaic element comprises two or more strip photovoltaic elements.

5. The multifunctional glazing unit according to claim 4, wherein the two or more strip photovoltaic elements are spaced apart, substantially in parallel.

6. The multifunctional glazing unit according claim 5, wherein the two or more strip photovoltaic elements are spaced apart with a pitch of from 2 mm to 6 mm.

7. The multifunctional glazing unit according to claim 1, wherein the reflecting element is secured within the cavity.

8. The multifunctional glazing unit according to claim 1, wherein the one or more slats comprises a first coating.

9. The multifunctional glazing unit according to claim 8, wherein the first coating comprises a reflective coating.

10. The multifunctional glazing unit according to claim 9, wherein the reflective coating comprises one or more coating layers.

11. The multifunctional glazing unit according to claim 10, wherein one of the one or more coating layers comprises at least 98% by weight aluminium.

12. The multifunctional glazing unit according to claim 1, further comprising a third sheet of glazing material comprising a first face and a second face; and wherein the third sheet of glazing is positioned between the first and second sheets of glazing material and wherein the first face of the third sheet of glazing material faces towards the first sheet of glazing material; and the second face of the third sheet of glazing material faces towards the second sheet of glazing material.

13. The multifunctional glazing unit according to claim 12, wherein the third sheet of glazing material bisects the cavity to form a first cavity portion and a second cavity portion.

14. The multifunctional glazing unit according to claim 12, further comprising a sheet of interlayer material located between the first sheet of glazing material and the third sheet of glazing material.

15. The multifunctional glazing unit according to claim 14, wherein the sheet of interlayer material is laminated between the first sheet of glazing material and the third sheet of glazing material.

16. The multifunctional glazing unit according to claim 12, wherein the photovoltaic element is positioned between the first sheet of glazing material and the third sheet of glazing material.

17. The multifunctional glazing unit according to claim 12, wherein the reflecting element is positioned between the first sheet of glazing material and the third sheet of glazing material.

18. A process for manufacturing a multifunctional glazing unit, comprising the steps of:
   i) providing a first sheet of glazing material and a second sheet of glazing material;
   ii) providing one or more spacer bars;
   iii) separating the first sheet of glazing material and the second sheet of glazing material with the one or more spacer bars to provide a cavity that is a heat insulating cavity sealed by at least on spacer bar; and
   iv) positioning a photovoltaic portion and a reflecting element between the first sheet of glazing material and the second sheet of glazing material to form the multifunctional glazing unit, with the reflecting element spaced apart from the second sheet of glazing material,
   wherein the photovoltaic portion in direct contacts with the first sheet of glazing material;
   wherein the photovoltaic portion comprises: a transparent region; a bi-facial region; and at least one photovoltaic element,
   wherein the reflecting element comprises an adjustable transparency reflecting element, and
   wherein the reflecting element comprises a plurality of rotatable slats.

19. A multifunctional glazing unit comprising:
   a first sheet of glazing material comprising a first face and a second face;
   a second sheet of glazing material comprising a first face and a second face;
   a photovoltaic portion; and
   a reflecting element;
   wherein the first sheet of glazing material and the second sheet of glazing material are separated by a cavity that is a heat insulating cavity sealed by at least one spacer bar; and wherein the second faces of each sheet of glazing material face towards the cavity; and wherein the photovoltaic portion and the reflecting element are each positioned between the first sheet of glazing material and the second sheet of glazing material with the reflecting element spaced apart from the second sheet of glazing material;
   wherein the photovoltaic portion in direct contacts with the first sheet of glazing material;
   wherein the photovoltaic portion comprises a transparent region, a bi-facial region, and at least one photovoltaic element;
   wherein the reflecting element comprises an adjustable transparency reflecting element that is sealed within the heat insulating cavity; and
   wherein the reflecting element comprises a plurality of rotatable slats.

* * * * *

UNITED STATES PATENT AND TRADEMARK OFFICE
CERTIFICATE OF CORRECTION

| | | |
|---|---|---|
| PATENT NO. | : 11,959,334 B2 | Page 1 of 1 |
| APPLICATION NO. | : 16/763270 | |
| DATED | : April 16, 2024 | |
| INVENTOR(S) | : Marcel Ribberink | |

It is certified that error appears in the above-identified patent and that said Letters Patent is hereby corrected as shown below:

In the Claims

Claim 1, Line 18, "in direct contacts with" should be changed to -- directly contacts --.

Claim 18, Line 15, "in direct contacts with" should be changed to -- directly contacts --.

Claim 19, Line 18, "in direct contacts with" should be changed to -- directly contacts --.

Signed and Sealed this
Fourth Day of June, 2024

Katherine Kelly Vidal
*Director of the United States Patent and Trademark Office*